United States Patent
Galzur et al.

(10) Patent No.: US 6,981,188 B2
(45) Date of Patent: Dec. 27, 2005

(54) NON-VOLATILE MEMORY DEVICE WITH SELF TEST

(75) Inventors: Ori Galzur, Modiin (IL); Tamas Toth, Moshav Ometz (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 619 days.

(21) Appl. No.: 09/931,848

(22) Filed: Aug. 16, 2001

(65) Prior Publication Data

US 2003/0037295 A1   Feb. 20, 2003

(51) Int. Cl.[7] .............................................. G11C 29/00
(52) U.S. Cl. ....................... 714/719; 714/718
(58) Field of Search ........................ 365/201, 189.07, 365/189.01, 200; 714/718–723

(56) References Cited

U.S. PATENT DOCUMENTS

| | | | |
|---|---|---|---|
| 5,640,354 A | * | 6/1997 | Jang et al. ................... 365/201 |
| 6,218,695 B1 | | 4/2001 | Nachumovsky |
| 6,347,056 B1 | * | 2/2002 | Ledford et al. ............. 365/201 |

* cited by examiner

Primary Examiner—Joseph Torres
Assistant Examiner—John J. Tabone, Jr.
(74) Attorney, Agent, or Firm—Bever, Hoffman & Harms, LLP; Patrick T. Bever (57) ABSTRACT

Self-test instructions are loaded from a tester into a configuration array of a memory device, and then a control circuit of the memory device sequentially reads and executes the self-test instructions while the tester is in an idle state. Data patterns are written to a main memory array of the memory device the internal self-test process. The control circuit includes a comparator for detecting defective memory cells by comparing data values read from the main array with the data pattern previously written into the main memory array. A BIN counter identifies the currently-executed self-test instruction, and is read and transmitted to the tester when an error is detected.

11 Claims, 6 Drawing Sheets

NON-VOLATILE MEMORY DEVICE WITH SELF TEST

FIELD OF THE INVENTION

The present invention relates to non-volatile memory cells. More specifically, the present invention relates to a method and structure for performing wafer sort tests on an EEPROM circuit including an array of 2-bit non-volatile memory cells.

BACKGROUND OF THE INVENTION

Most memory devices can be categorized into two broad categories: volatile memory devices and non-volatile memory devices. Volatile memory devices include static random access memory (SRAM) cells and dynamic random access memory (DRAM) cells that require a power source to retain data. SRAM cells include a bistable flip flop circuit that needs an applied DC current to retain its bistable state, which determines the stored data value. A DRAM cell stores a data value as a charge on a capacitor that must be periodically refreshed. In either type of volatile memory cell, the stored data value is lost when power to the cell is turned off.

In contrast to volatile memory cells, the charge stored in non-volatile memory (NVM) cells is retained even if power is turned off. NVM cells typically include both a control gate and a floating (i.e., electrically isolated) gate, which can be programmed to store either a negative charge or a neutral charge. The amount of charge stored on the floating gate affects the threshold voltage of the flash cell (i.e., the voltage applied to the control gate at which the flash memory transistor turns on to allow current to flow through the NVM cell). When storing a negative charge (i.e., programmed), the negative charge stored on the floating gate prevents the NVM cell from turning on at the low control gate voltages used for reading the flash cell during a read operation. When storing a neutral charge (i.e., erased), the neutral charge stored on the floating gate allows the NVM cell to be turned on or off by the voltage applied to the control gate.

Memory devices are typically tested several times before they are sold to a customer to assure that they work properly. One such test, known as a wafer sort test, is performed after the memory devices are fabricated on a wafer and before the wafer is diced into individual die or "chips". Wafer sort testing is used to identify non-functional memory devices that can be discarded (sorted out) during the subsequent dicing process. Additional testing may be performed during the fabrication process and/or after the memory devices are packaged.

Figure 1:
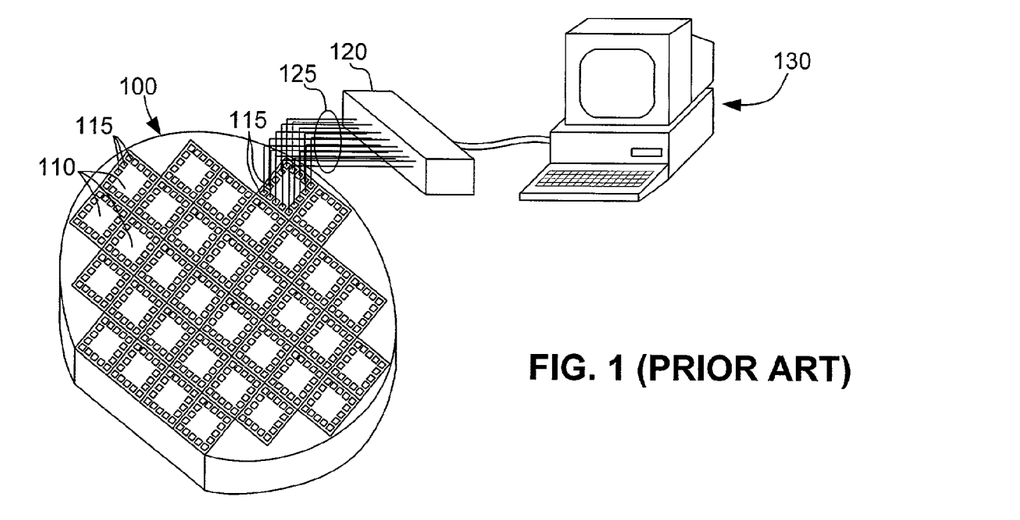
FIG. 1 is a simplified diagram showing a wafer connected to a tester during wafer sort testing.

FIG. 1 is a simplified diagram showing a wafer 100 during a typical wafer sort test procedure. Wafer 100 includes multiple memory devices 110 including arrays of memory cells (not shown) that are electrically connected using well-established metallization techniques to contact pads 115 located on an upper surface thereof. The wafer sort test process includes moving wafer 100 or a test arm 120 such that thin metal test probes 125 extending from test arm 120 are brought into contact with contact pads 115 of one or more selected memory devices 110. After contact is established power and test signals are transmitted from a tester (e.g., a work station) 130 to the selected memory device 110 via test probes 125, and test results are transmitted back from the selected memory device 110 to tester 130. The actual test results received from selected memory device 110 are compared by tester 130 with stored expected test results, and the selected memory device 110 is designated as either functional or defective based upon this comparison. This test is then repeated for all memory devices 110 on wafer 100.

Figure 2:
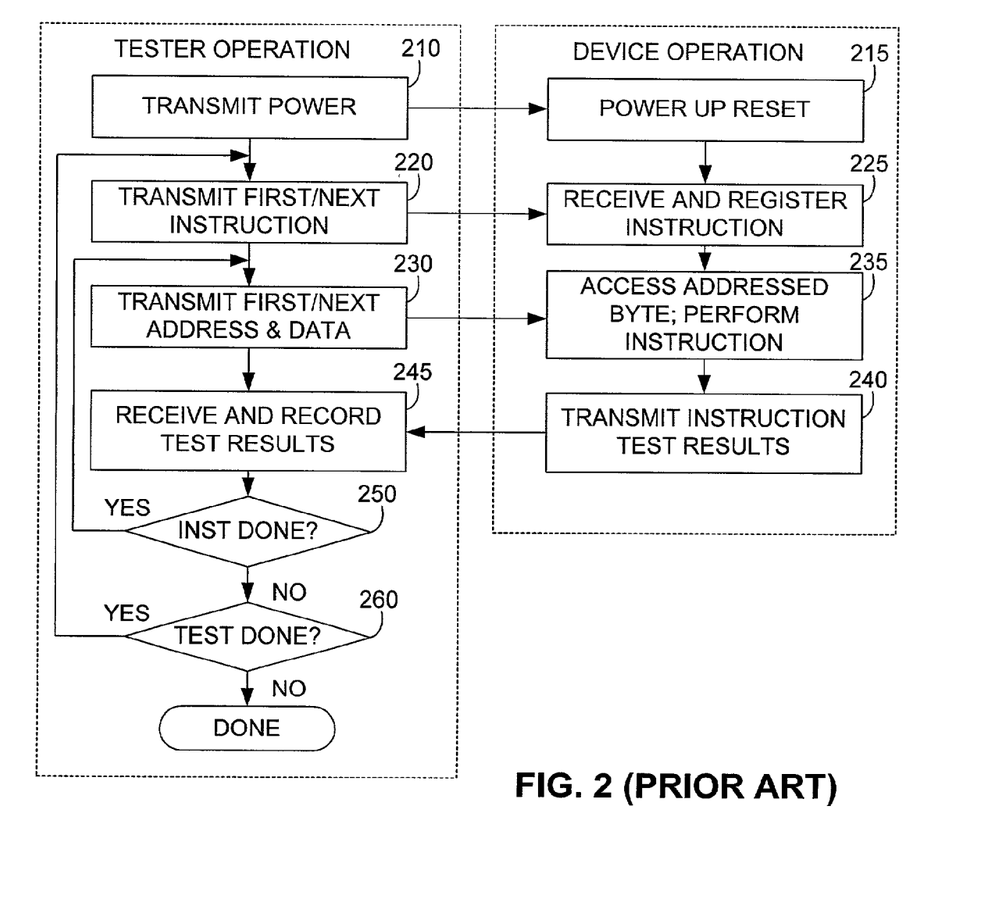
FIG. 2 is a flow diagram showing a conventional external wafer sort test procedure.

FIG. 2 is a flow diagram illustrating the transmission of data between tester 130 and memory device 110 during a conventional external wafer sort test procedure. When probes 125 are brought into contact with contact pads 115 of a selected memory device 110 (see FIG. 1), power is transmitted via associated probes (Step 210) that causes the selected memory device 110 to "wake up" and perform an internal reset procedure (Step 215). After the selected memory device 110 is reset, the tester sends a first instruction (e.g., write) to the memory device (Step 220), and the memory device registers the instruction in an appropriate control register (Step 225). Subsequently, a series of addresses and/or data values are transmitted from the tester (Step 230) that are utilized to access memory locations (e.g., bytes) of the memory device for purposes of performing the designated instruction (e.g., read, write, erase, etc.; Step 235). When data is read from a particular memory location and/or other test functions are performed for which test data is generated, the memory device transmits the test results (Step 240), which are received and stored by the tester (Step 245). The process of transmitting address/data signals and performing the selected instruction is repeated for all memory locations until the entire memory device has been tested (Step 250), and then the address/data transmission process is restarted and repeated for each subsequent test instruction until all instructions have been completed (Step 260). Upon completion of the test instructions (or, alternatively, upon receipt of an error message during one of the instructions), the tester designates the selected memory device as either "good" or "bad" for the wafer sorting process.

A problem associated with the conventional external test procedure described above is that the transmission of instructions, address/data signals and test results between the tester and the selected memory device is slow, thereby requiring a relatively long period of time to perform the wafer sort test. This long test period slows down production, and ultimately increases the cost of the memory devices.

What is needed is a memory device that facilitates the performance of sort testing in a minimum amount of time, thereby reducing production costs.

SUMMARY OF THE INVENTION

In accordance with the present invention, a non-volatile memory device is provided in which self-test instructions are loaded from a tester into a special (configuration) array of memory cells, and a special control circuit of the memory device then sequentially reads and executes the self-test instructions while the tester is in an idle state (i.e., transmitting neither data nor address signals to the memory device). During the execution of the self-test instructions, data patterns are written to and read from the main memory array according to the stored self-test instructions. Because the memory device performs the predice wafer sort test procedure internally (i.e., without passing data and address signals to and from the tester), the amount of time needed to perform wafer sort test procedure is significantly reduced, thereby reducing manufacturing costs.

In accordance with an embodiment of the present invention, the control circuit of the non-volatile memory device includes a command register and a comparator. After the tester writes the self-test instructions into the configuration array of the memory device, the tester transmits a start command to the command register. In response to the start command, during a first operating phase, the command register addresses the first self-test instruction in the configuration array, and overwrites the start command in the command register with the first self-test instruction. Subsequently, during a second operating phase, the command register performs the self-test instruction, which involves either writing (i.e., programming or erasing) data values to the memory cells of the main array, or reading/comparing data values from the main array. During write operations, predefined data patterns (i.e., all logic 1 values, all logic 0 values, or alternating logic 1 and logic 0 values) are entered into the memory cells of the main memory array. During read/compare operations, the previously written data is read from the main array and transmitted to the comparator of the control circuit, where the read data compared with the predefined data patterns to detect errors (i.e., defective memory cells). Upon completing each self-test instruction, the control circuit reads a next sequential self-test instruction from the configuration array, writes the self-test instruction in the command register, and then performs the self-test instruction. Execution of the self-test instructions proceeds until an end test command is written into the command register, at which point the memory device notifies the tester that the self-test process is completed.

In accordance with another aspect of the present invention, one or more test mode registers and a bin counter are utilized to address the self-test instructions in the configuration array. At the beginning of the self-test process, a first column address is written from, for example, a test mode register into the bin counter, which in turn controls the address register to access the first self-test instruction in the configuration array. Upon completing the first self-test instruction, the bin counter is incremented to address the second self-test instruction, and so on until all of the self-test instructions have been executed. In addition to coordinating the sequential execution of the self-test instructions, the bin counter can be utilized during failure analysis to identify the source of failure. Specifically, when an error occurs and the self-test process is terminated, the bin counter contents can be read to identify the self-test instruction being performed when the error occurred.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 3:
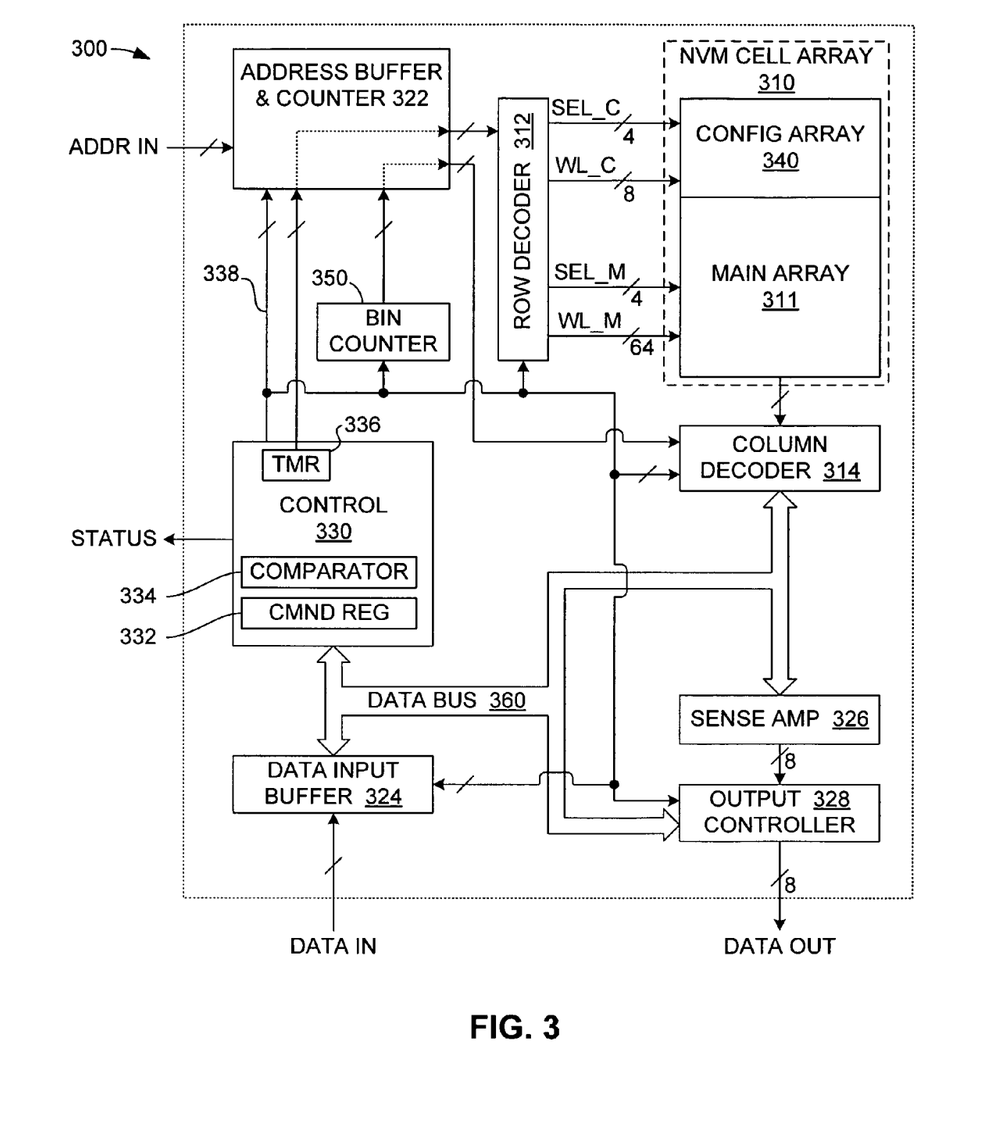
FIG. 3 is a block diagram showing a memory device according to an embodiment of the present invention.

FIG. 3 is a block diagram showing a non-volatile memory device 300 according to an embodiment of the present invention. Memory device 300 includes a non-volatile memory (NVM) cell array 310 including a main memory array 311 for storing a user's data, a configuration (second) memory array 340 for storing self-test instructions that are performed during a novel wafer sort process, a row decoder 312 for accessing selected rows of NVM cell array 310, and a column decoder 314 for accessing selected columns of NVM cell array 310. The selected rows and columns are addressed using an address buffer/counter 322, which generates row and column addressing signals in response to applied address signals (ADDR IN) that are received from an external source, or in response to address codes received, for example, from control circuit 330. The row and column address signals generated by address buffer 322 are applied to row decoder 312 and column decoder 314, respectively. During normal operation, data values are written to main array 311 through a data input buffer 324, which passes input data (DATA IN) to column decoder 314 for writing into main array 311. Similarly, data values read from main array 311 are passed from column decoder 314 to a sense amplifier circuit 326, and from sense amplifier circuit 326 to an output control circuit 328 for selective transmission out of memory device 300 as output data (DATA OUT).

Figure 4:
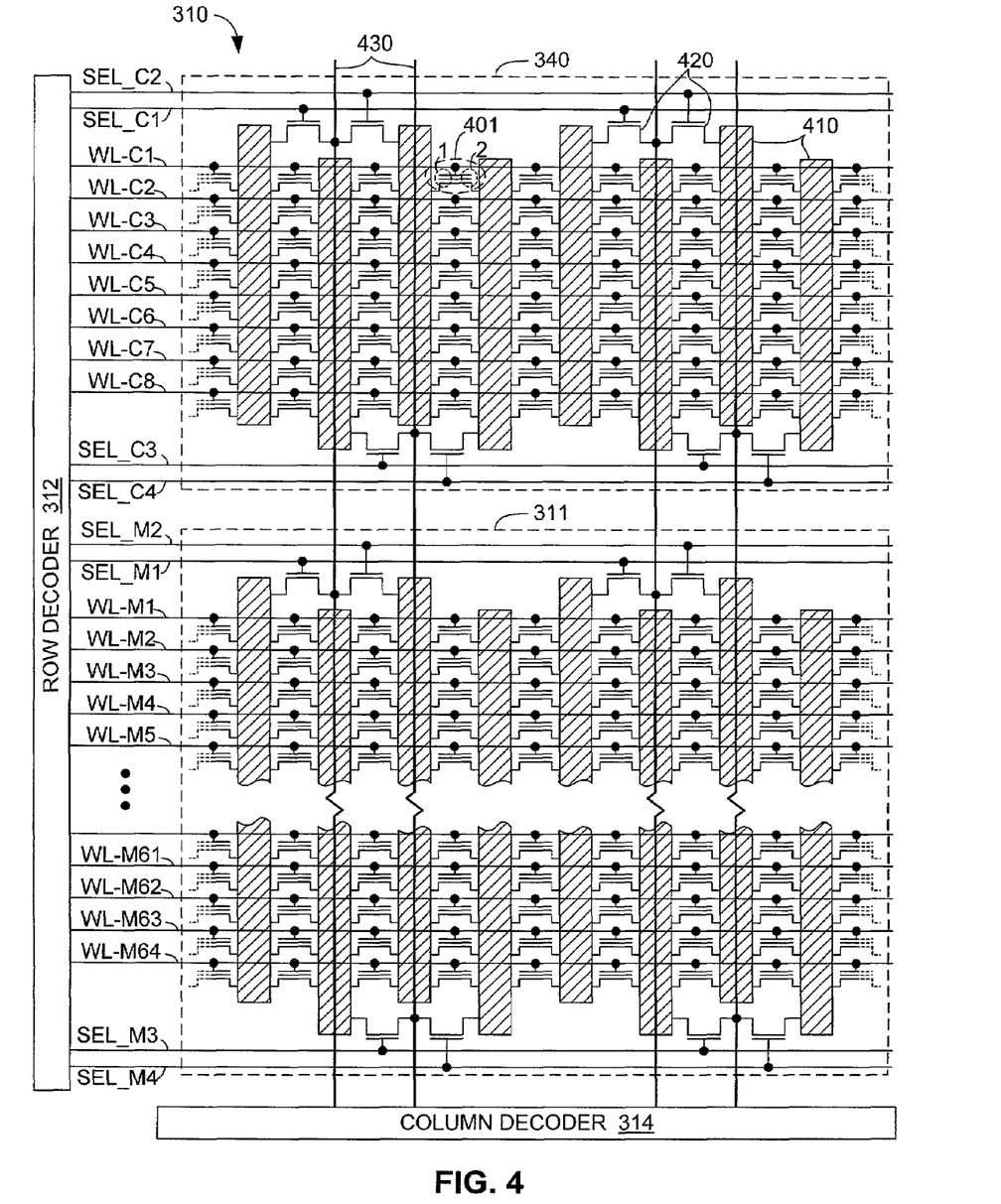
FIG. 4 is a simplified circuit diagram showing a memory array of the memory device shown in FIG. 4.

FIG. 4 is a simplified diagram showing NVM cell array 310 in additional detail. In accordance with the disclosed embodiment, each NVM cell 401 of NVM cell array 310 includes an oxide-nitride-oxide (ONO) charge trapping structure that allows each NVM cell 401 to store two bits (indicated in FIG. 4 as bit "1" and bit "2"). Memory arrays that include 2-bit NVM cells 401 are typically formed in blocks, each block including several NVM cells 401 connected between parallel elongated diffused (e.g., n+) regions 410. The signals applied to or read from NVM cells are transmitted through diffusion regions via select transistors 420, which are controlled by select signals transmitted from row decoder 312. Data bit values are read from a selected row of NVM cells 401 by generating appropriate select signals and generating an associated word line control signal to pass selected bit values to a series of metal lines 430, which are connected to column decoder (multiplexer circuit) 314. Additional information regarding the structure and operation of such NVM cell arrays can be found in co-owned U.S. Pat. No. 6,218,695, which is incorporated herein in its entirety.

In accordance with the present invention, main array 311 and configuration block 340 of NVM cell array 310 are formed as two separate blocks (arrays), each having its own set of select lines. Specifically, main array 311 is accessed using select lines SEL__M1 through SEL__M4, and configuration array 340 is accessed using select lines SEL__C1 through SEL__C4. As described below, select lines SEL__C1 through SEL__C4 are only accessible in a special "engineering" operating mode that prevents access during normal user operations. However, configuration array 340 is connected to the same addressing circuitry (i.e., row decoder 312, metal lines 430, and column decoder 314) to facilitate reading from and writing to configuration array 340 with minimal additional control circuitry. Further, configuration array 340 may perform functions in addition to the self-test process (described below) after wafer sort testing is completed, such as storing device operating information used at power-up, and device identification information that can be used to identify a device for troubleshooting or security reasons.

Returning to FIG. 3, in accordance with a second aspect of the present invention, to facilitate writing, reading, and executing the self-test instructions, control circuit 330 is provided with a command register 332, a comparator circuit 334, one or more optional test mode register (TMR) 336, and a command bus 338 for transmitting command data to various structures of memory device 300. Command register 332 is utilized to receive self-test instructions read from configuration array 340 (or from an external source, such as a tester), and to control various circuits of memory device 300 for performing the stored self-test instructions. Comparator circuit 334 is utilized to perform on-chip testing by comparing data values read from main memory array 311 with predetermined values to verify that the memory cells of memory array 311 are operating properly. Optional TMR 336 is utilized to store test mode parameters.

In accordance with a third aspect of the present invention, memory device 300 includes a BIN counter 350 that stores column address data utilized to address a selected column of NVM cell array 310 during the self-test process. As described in additional detail below, during the self-test process, BIN counter 350 is used to address self-test instructions stored in configuration array 340 for writing to control register 332. In addition, the address stored in BIN counter 350 can be read when comparator circuit 334 detects a defective memory cell to facilitate troubleshooting. In one embodiment, the column address of a first self-test instruction stored in configuration array 340 is transmitted from TMR 336 to BIN counter 350 at the beginning of a self-test process.

In accordance with a fourth aspect of the present invention, a data bus 360 is utilized to pass information between data input buffer 324, control circuit 330, column decoder 314, and output controller 328 in accordance with control signals generated by control circuit 330 and transmitted on control bus 338. During the self-test process, data bus 360 is utilized to pass self-test instructions registered in output controller 328 (which are read from configuration array 340) to command register 332 of control circuit 330. Data bus 360 is operated according to known techniques.

In accordance with yet another aspect of the present invention, a method for performing wafer sort on a non-volatile memory device, such as memory device 300, includes writing a series of self-test instructions from a tester to the configuration (first) array 340 of the non-volatile memory device, and then transmitting a start command that causes control circuit 330 to sequentially read and execute the series of self-test instructions from configuration array 340. Execution of the series of self-test instructions involves writing at least one data pattern (e.g., 00, 01, 10, or 11) into main array (second memory cells) 310, reading data from main array 311, and then comparing the read data with the data pattern using comparator circuit 334 to detect defective memory cells in main array 311. The self-test method is described in additional detail below with reference to FIG. 5.

Figure 5:
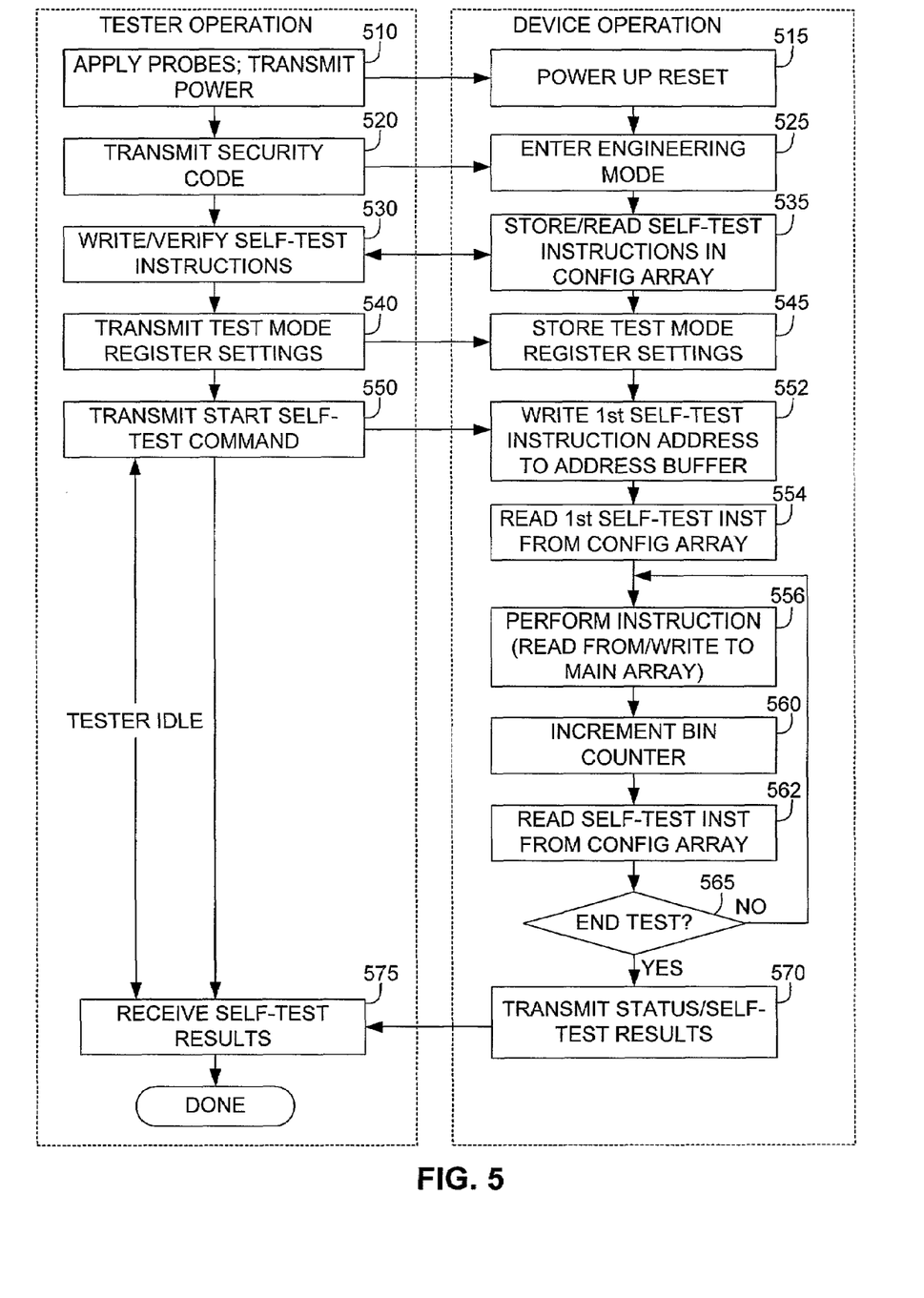
FIG. 5 is a flow diagram showing an internal self-test process according to an embodiment of the present invention.

Referring to the top of FIG. 5, in accordance with known wafer sort methods, probes are applied to contact pads and power applied (block 510) in a manner similar to that shown in FIG. 1 (described above). Upon power up, memory device 300 performs an optional reset operation (block 515) according to reset program that is, for example, hard-wired into the control circuit 330. In one embodiment, this reset operation includes resetting all registers, power supplies, and configuration bits of memory device 300 to predetermined default values.

Next, an optional security code (sequence) is transmitted from the tester to the memory device (block 520) via data input buffer 324 that causes memory device 300 to enter a special engineering mode (block 525). The engineering mode is a special operating mode that allows access to configuration array 340, which cannot be addressed during "normal" operation of memory device 300. In one embodiment, configuration memory 340 is accessible only to the device manufacturer using the security code, and is utilized to store performance-related parameters (e.g., the number of pulses needed to erase or program the non-volatile memory cells, etc.). Accordingly, the present invention involves writing self-test instructions into non-volatile memory cells that are not accessible to (and therefore cannot be changed by) an end user. In another embodiment, the self-test instructions can be stored in user-accessible memory cells (e.g., those designated for storing one-time programmable (OTP) parameters). However, in either case, the self-test instructions are not stored in main array 311.

After entering the engineering mode, self-test instructions are then written from the tester (block 530) and stored in configuration array 340 (block 535). The process of writing self-test instructions is shown in FIG. 6.

Figure 6:
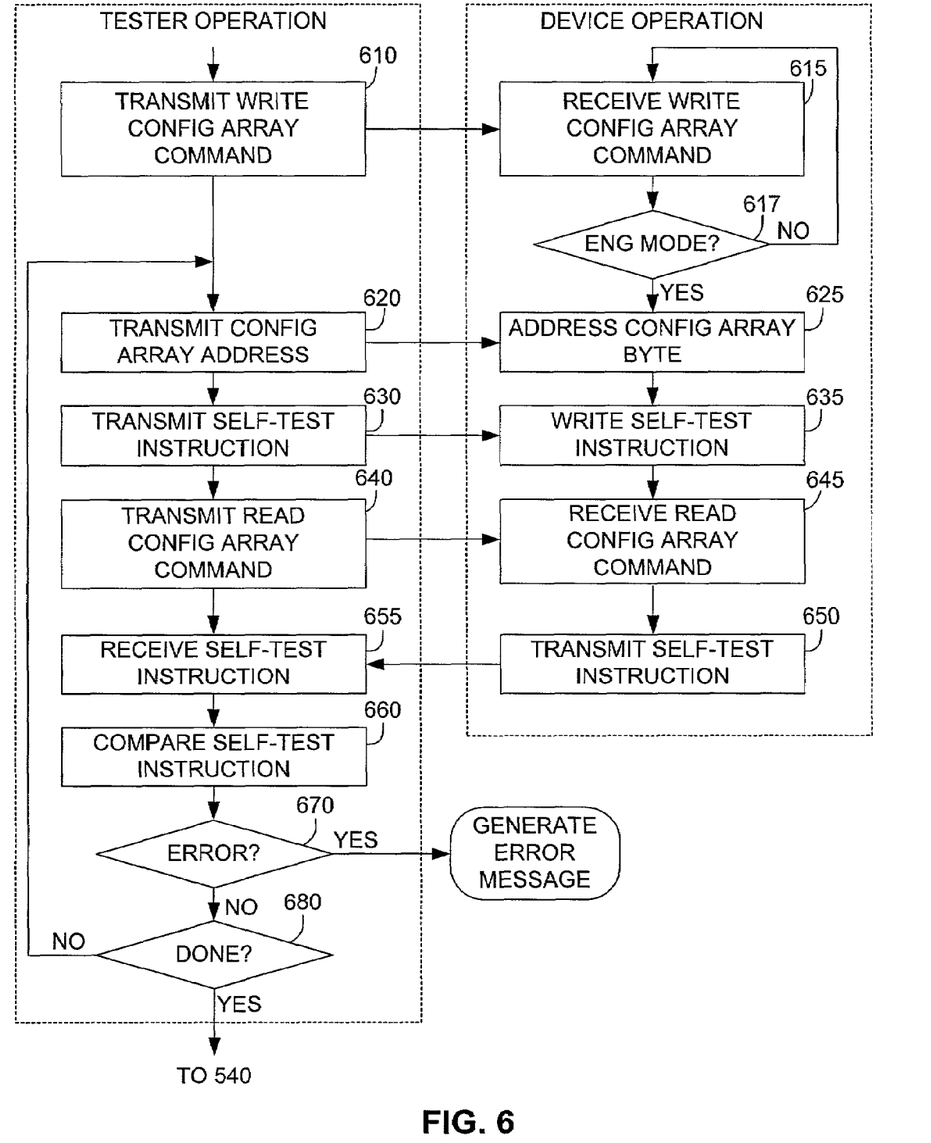
FIG. 6 is a flow diagram showing a process of transferring self-test instructions from a configuration memory during the self-test process shown in FIG. 5.

Referring to the upper left side of FIG. 6, the process of writing self-test instructions begins by transmitting a special write configuration array command (block 610) from the tester into command register 332 of memory device 300, which causes control circuit 330 to generate a write configuration memory enable (WE_CFGR) signal (see FIG. 3). Note that the special write command only facilitates access to configuration array 340 while memory device 300 is in the engineering mode (ENG MODE; block 617). Subsequently, the tester transmits the address of a first byte in configuration array 340 (block 620), which is received and used by address buffer and counter 322, row decoder 312 and column decoder 314 (see FIG. 3) to address the first byte of configuration array (block 625). A first self-test instruction is then transmitted by the tester (block 630) which is passed via data input buffer 324, data bus 360, and column decoder 314 to the first byte of configuration array 340 (block 635). Subsequently, an optional verification process is performed by writing a read configuration array command (block 640) that is registered in command register 332 (block 645), and causes the previously-written self-test instruction to be transmitted to the tester via column decoder 314, sense amplifier 326 and output controller 328 (block 650). Upon receiving the self-test instruction transmitted from configuration array 340 (block 655), the tester compares the received self-test instruction with the previously transmitted self-test instruction (block 660) using known techniques. If the received self-test instruction fails to match the transmitted self-test instruction (YES in branch 670), then an error message is generated indicating that memory device 300 is defective. Conversely, if the received self-test instruction matches the transmitted self-test instruction (NO in branch 670), then boxes 620 through 670 are repeated (NO in branch 680) for each self-test instruction (addressing a next sequential configuration array byte for each corresponding self-test instruction) until all self-test instructions have been successfully written into configuration array 340.

Returning to the left side of FIG. 5, after the self-test instructions are successfully written into the configuration array, the tester transmits test mode register setting data (block 540) that is stored in a control register of the NVM device (block 545). Referring to FIG. 3, in one embodiment, the test mode register setting information is transmitted to TMR 336 via data input buffer 324 and command register 332, and includes multiple code (single or multiple bit patterns) that set parameters associated with the self-test process. For example, setting codes may be included that identify the type of test being performed (i.e., either the internal self-test of the present invention, or an externally controlled test similar to the conventional tests described above), the maximum number of pulses to be used during erase and program (write) operations, and a code identifying the row address of configuration array 340 storing the first self-test instruction. Although only a single test mode register is indicated in FIG. 3, two or more test mode registers may be provided to perform various self-test processes (e.g., margin test or stress test) that are known to those familiar with non-volatile memory devices. In one embodiment, the test mode setting information is transmitted in a two-part process: a first word is transmitted into command register 332 indicating that the next command is to be written into TMR 336, and then the test mode setting information is transmitted over data bus to TMR 336 under the control of command register 332.

Referring again to FIG. 5, after the TMR setting information is transferred, a start self-test command is transmitted from the tester (block 550), which is stored in the control circuit of the NVM device. Referring briefly to FIG. 3, in one embodiment, the start self-test command transmitted from the tester stored in command register 332. As indicated on the left side of FIG. 5, and in accordance with an aspect of the present invention, the tester then enters an idle state during which the tester waits for memory device 300 to complete the self-test process. In contrast to conventional testing processes (described above), address and data signals are not transmitted to and from the tester during the self-test process, thereby significantly reducing the time needed to perform wafer sort testing.

Referring to the right side of FIG. 5, upon receiving the start self-test command, control circuit 330 causes TMR 336 to transmit a first (row) address code that causes address buffer 332 to access a first configuration array row containing the first self-test instruction, and causes BIN counter 350 to transmit a second (column) address code that causes address buffer 332 to access the first byte in the first configuration array row (block 552). Accordingly, address buffer 332 accesses and reads the first byte of the first configuration memory row (block 554), which stores the first self-test instruction. The first self-test instruction is passed via column decoder 314, sense amplifier 326, output controller 328 and bus 360 to command register 332, where the first self-test instruction over-writes the start self-test process command. The first self-test instruction is then performed (block 556).

In accordance with another aspect of the present invention, each self-test instruction includes several fields including a command field, an optional array field, and a data pattern. The command field identifies the operation to be performed (e.g., read, program, or erase). The optional array field indicates the array being tested (e.g., main array 311 or an optional user-accessible array (not shown)). The pattern field indicates the two-bit data pattern (e.g., 00, 01, 10, or 11) to be written into or read from the array during the test. Note that when a selected two-bit data pattern is written into main array 311, the first bit is written into the even-numbered bits of each byte (e.g., bits 0, 2, 4, and 6), and the second bit is written into the odd-numbered bits of each byte (e.g., bits 1, 3, 5, and 7). For example, when the data pattern 01 is written into main array 311, the data value 0 (or 1) is written into the even-numbered bits of each byte of main array 311, and the data value 1 (or 0) is written into the odd-numbered bits of each byte. Similarly, when a byte is read from main array 311, the first bit of a previously-written data pattern is read from the even-numbered bits of each byte, and the second bit is read from the odd-numbered bits. For example, during a read/compare operation performed after the data pattern 01 is written into main array 311, the data value 0 (or 1) is read from the even-numbered bits of each byte of main array 311 and the data value 1 (or 0) is read from the odd-numbered bits of each byte (provided the byte does not contain defective memory cells).

Figure 7:
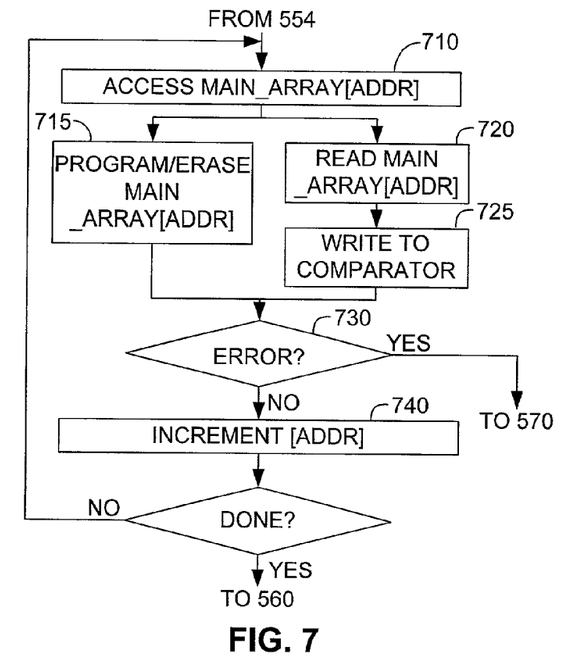
FIG. 7 is a flow diagram showing a process of executing self-test instructions during the self-test process shown in FIG. 5.

FIG. 7 is a flow diagram showing an example of a process associated with the execution of a self-test instruction in accordance with a simplified embodiment. Note that the counter of address buffer 322 (see FIG. 3) is reset to address a first byte of main array 311. This first byte (MAIN_ARRAY[ADDR]) is then accessed using row decoder 312 and column decoder 314 (block 710), and then the current self-test instruction is performed on the first byte. If the current self-test instruction includes erasing (writing logic "1") or programming (writing logic "0") to one or more bits of the first byte (block 715) then this process is performed according to established practices. Conversely, if the current self-test instruction is to read/compare the first byte, then the byte is read (block 720) and then written to comparator 334 using data bus 360 (see FIG. 3) (block 725). If an error is detected during the program, erase, or read/compare operations (YES in branch 730), then the self-test process is terminated and the tester is notified (i.e., control is passed to block 570; see FIG. 5). Such an error is detected during programming or erasing when the maximum number of program/erase pulses, which is stored in TMR 336, is exceeded without successfully programming or erasing one or more bits of the byte. Alternatively, an error is also detected when the byte indicates an incorrect data value when compared with the expected data pattern in comparator 334 (see FIG. 3). If no error is detected in branch 730, then the counter of address buffer 322 is incremented to the address corresponding to the next sequential byte (block 740). The above process is then repeated for all bytes of main array 311, and then control passes to block 560 (see FIG. 5).

Referring again to FIG. 5, upon completing a self-test instruction, BIN counter 350 is incremented (block 560), and the next sequential self-test instruction is read from configuration array 340 (block 562). If the next sequential self-test instruction is an END TEST instruction (YES in branch 565), then memory device 300 notifies the tester of the completed test status (block 570). If the next sequential self-test instruction is not an END TEST instruction (NO in branch 565), then control passes back to block 556. Accordingly, self-test instructions are sequentially performed until an error is detected, or until all scheduled self-test instructions are completed.

In accordance with another aspect of the present invention, BIN counter 350 is utilized to assist in failure analysis by identifying the self-test instruction during which an error has occurred. As described above, when an error occurs during the execution of a particular self-test instruction (e.g., block 730; see FIG. 7), the self-test process is terminated and the tester is notified. At the time of termination BIN counter 350 stores the address of the particular self-test instruction, thereby indicating the instruction that was being performed when the error occurred (e.g., program, erase, read/compare). Therefore, transmitting the BIN counter contents to the tester upon error detection facilitates failure analysis. Reading and transmitting the contents of BIN counter 350 can be performed automatically upon error detection, or can be performed using a special command selectively transmitted to control circuit 350. Note that the contents of address buffer 322 may be similarly provided to identify the specific byte producing the error.

Figure 8:
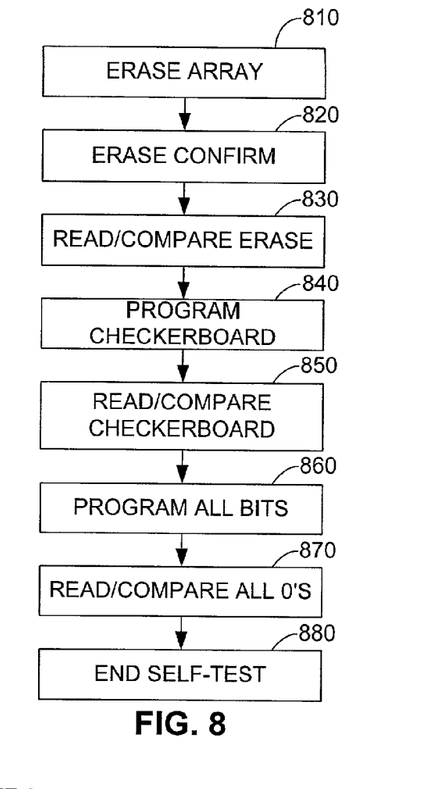
FIG. 8 is a flow diagram showing a sequence of self-test instructions according to an embodiment of the present invention.
Figure 9A:
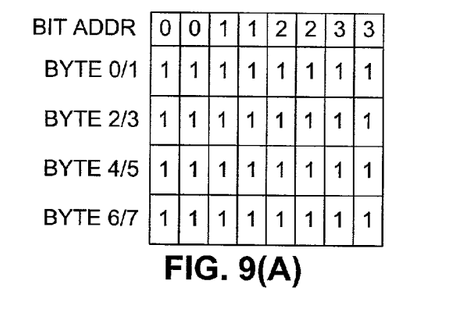
FIGS. 9(A), 9(B), and 9(C) are tables showing the data values stored main memory array bytes during the sequence of self-test instructions shown in FIG. 8.
Figure 9B:
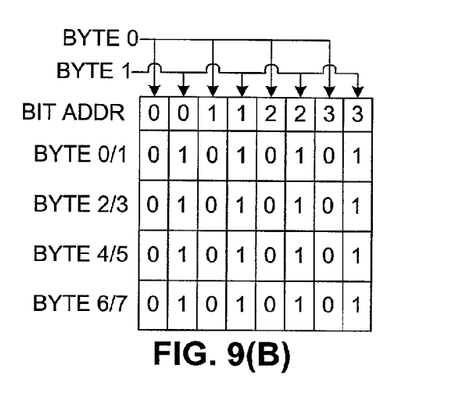
Figure 9C:
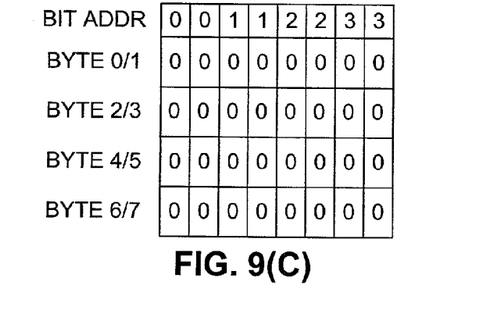

In accordance with yet another aspect of the present invention, by systematically programming and erasing the memory cells of main array 311, a comprehensive self-test process is performed that verifies the operability of memory device 300 without time-consuming interface with a tester. FIG. 8 provides an example of a self-test instruction sequence that facilitates such a comprehensive self-test process. In a first self-test instruction, all memory cells of main array 311 are erased (i.e., data pattern 11 is written) (block 810). FIG. 9(A) is a table showing an example of several bytes after this erase instruction is performed (i.e., all bytes store logic 1 values). Subsequently, successful erasure is confirmed (block 820) and then all bytes are read and compared with the 11 data pattern (block 830). Next, a "checkerboard" data pattern (e.g., 10 or 01) is written into main array 311 (block 840), thereby programming either the odd-numbered or the even-numbered bytes of main array 311. FIG. 9(B) is a table showing an example of several bytes after such a checkerboard data pattern is written. Note that when two-bit NVM cells 401 are utilized in main array 311 (see FIG. 4), the individual bits associated with two adjacent bytes are typically interleaved, as shown in FIG. 9(B). In one embodiment, when the checkerboard data pattern is written, all even bytes (e.g., byte 0) store logic 0 values, and all odd bytes store logic 1 values. Subsequently, successful writing of the checkerboard data pattern is confirmed by reading and comparing all bytes of main array 311 with the checkerboard data pattern using comparator 334 (block 850). Next, all memory cells of main array 311 are programmed (i.e., logic 0 values are written to the odd bits) (block 860) to produce the pattern shown in FIG. 9(C), and then the successful programming of all bytes is confirmed by reading and comparing all bytes of main array 311 with the 00 data pattern using comparator 334 (block 870). The final self-test instruction is END SELF-TEST (block 880).

Because self-test instructions are selectively entered into the configuration memory during wafer sort, memory devices produced in accordance with the present invention facilitate flexible and efficient wafer sort operations with a minimal chip area cost. In one practical embodiment, the area required for control circuit 340 was increased by only 10% to facilitate the self-test process, which constituted only a 1.5% increase in total chip size. Additional conventional test functions (i.e., other than those described above) can be supported with an associated increase in chip size.

Although the present invention has been described with respect to certain specific embodiments, it will be clear to those skilled in the art that the inventive features of the present invention are applicable to other embodiments as well, all of which are intended to fall within the scope of the present invention. For example, in the disclosed embodiments, main array 311 of NVM cell array 310 is assumed to be relatively small (e.g. 256K to 1M bytes), so configuration array 340 is formed by NVM cells to conserve space (see FIG. 3). In another embodiment (not shown) in which the main array is relatively large (e.g., 2M or more), and configuration array may be formed using volatile memory cells. That is, when the main memory is large, the space taken up by the configuration array is less significant, so the larger volatile memory cells can be used with a minimal increase in device size. Further, because the self-test instructions not used after the wafer sort test, there is no need to save the instructions. Moreover, the use of volatile configuration memory speeds up initial writing process.

What is claimed is:

1. A non-volatile memory device comprising:
a plurality of non-volatile memory cells including a first array for storing self-test instructions and a second array for storing data values;
a control circuit including a command register for receiving the self-test instructions from the first array during a first operating phase, and a comparator circuit for detecting defective non-volatile memory cells in the second array by comparing the data values with pre-defined values during a second operating phase;
an output controller for registering the self-test instructions read from the first array during the first operating phase; and
a data bus connected between the output controller and the control circuit for transmitting the self-test instructions to the command register during the first operating phase.

2. The non-volatile memory device according to claim 1, further comprising a data input buffer connected to the data bus and controlled by the control circuit such that data values received by the data input buffer are selectively passed to the command register.

3. A method for performing wafer sort testing on a non-volatile memory device using a tester, the non-volatile memory device including a first array of non-volatile memory cells, a second array of non-volatile memory cells, and a control circuit, the method comprising:
storing a series of self-test instructions transmitted from the tester in the first array of the non-volatile memory device, the series of self-test instructions including a first instruction and a second instruction;
reading the first instruction from the first array and transferring the first instruction to a command register of the control circuit, wherein the first instruction includes a pre-determined data pattern;
writing the predetermined data pattern to a second array of non-volatile memory cells in accordance with the first instruction stored in the command register; and
storing a first address code transmitted from the tester,
wherein reading the first instruction includes transmitting the first address code to an addressing circuit, whereby the addressing circuit accesses and reads the first instruction from the first array.

4. The method according to claim 3, wherein writing the predetermined data pattern to the second array comprises transmitting control signals from the control circuit to the addressing circuit that cause the addressing circuit to sequentially access each of the non-volatile memory cells of the second array.

5. The method according to claim 4, wherein writing the predetermined data pattern further comprises transmitting the predetermined data pattern to the addressing circuit such that the predetermined data pattern is repeatedly written into the sequentially accessed non-volatile memory cells.

6. A method for performing wafer sort testing on a non-volatile memory device using a tester, the non-volatile memory device including a first array of non-volatile memory cells, a second array of non-volatile memory cells, and a control circuit, the method comprising:

storing a series of self-test instructions transmitted from the tester in the first array of the non-volatile memory device, the series of self-test instructions including a first instruction and a second instruction;

reading the first instruction from the first array and transferring the first instruction to a command register of the control circuit, wherein the first instruction includes a predetermined data pattern;

writing the predetermined data pattern to a second array of non-volatile memory cells in accordance with the first instruction stored in the command register;

transferring the second instruction from the first array to the command register of the control circuit, the second instruction including a predetermined data pattern; and reading data values from the second array of non-volatile memory cells in accordance with the second instruction; and comparing the data values read from the second array with the predetermined data pattern stored in the command register.

7. A method for performing wafer sort testing on a non-volatile memory device using a tester, the non-volatile memory device including a first array of non-volatile memory cells, a second array of non-volatile memory cells, and a control circuit, the method comprising:

storing a series of self-test instructions transmitted from the tester in the first array of the non-volatile memory device, the series of self-test instructions including a first instruction and a second instruction;

reading the first instruction from the first array and transferring the first instruction to a command register of the control circuit, wherein the first instruction includes a predetermined data pattern; and writing the predetermined data pattern to a second array of non-volatile memory cells in accordance with the first instruction stored in the command register, wherein storing the series of self-test instructions comprises writing the series of self-test instructions into sequentially addressed non-volatile memory cells of the first array, wherein the method further comprises storing a first address code transmitted from the tester in a counter, wherein reading the first instruction includes transmitting the first address code from the counter to an addressing circuit, whereby the addressing circuit accesses and reads the first self-test instruction from the first array, and wherein reading the second instruction includes incrementing the counter to generate a second address code, and transmitting the second address code from the counter to the addressing circuit.

8. A method for performing wafer sort testing on a non-volatile memory device using a tester, the non-volatile memory device including a first array of non-volatile memory cells, a second array of non-volatile memory cells, and a control circuit, the method comprising:

storing a series of self-test instructions transmitted from the tester in the first array of the non-volatile memory device, the series of self-test instructions including a first instruction and a second instruction;

reading the first instruction from the first array and transferring the first instruction to a command register of the control circuit, wherein the first instruction includes a predetermined data pattern;

writing the predetermined data pattern to a second array of non-volatile memory cells in accordance with the first instruction stored in the command register; and storing a start self-test command transmitted from the tester in the command register, wherein the first instruction is read from the first array in response to the stored start self-test command.

9. A method for performing wafer sort testing on a non-volatile memory device using a tester, the non-volatile memory device including a first array of non-volatile memory cells, a second array of non-volatile memory cells, and a control circuit, the method comprising:

storing a self-test instruction transmitted from the tester in the first array of the non-volatile memory device;

reading the self-test instruction from the first array and transferring the self-test instruction to a command register of the control circuit, wherein the self-test instruction includes a predetermined data pattern;

reading data values from the second array of non-volatile memory cells in accordance with the self-test instruction; and comparing the data values read from the second array with the predetermined data pattern; and storing an address code transmitted from the tester, wherein reading the self-test instruction includes transmitting the address code to an addressing circuit, whereby the addressing circuit accesses and reads the self-test instruction from the first array.

10. The method according to claim 9, wherein reading the data values from the second array comprises transmitting control signals from the control circuit to the addressing circuit that cause the addressing circuit to sequentially access each non-volatile memory cell of the second array.

11. The method according to claim 10, wherein comparing the data values read from the second array with the predetermined data pattern further comprises transmitting the data values and the predetermined data pattern to a comparator.

* * * * *